United States Patent

Master et al.

[11] Patent Number: 5,988,485
[45] Date of Patent: Nov. 23, 1999

[54] FLUX CLEANING FOR FLIP CHIP TECHNOLOGY USING ENVIRONMENTALLY FRIENDLY SOLVENTS

[75] Inventors: Raj N. Master, San Jose; Orion K. Starr, Santa Clara; Mohammad Z. Khan, San Jose, all of Calif.

[73] Assignee: Advanced Micro Devices, Inc., Sunnyvale, Calif.

[21] Appl. No.: 09/040,651

[22] Filed: Mar. 17, 1998

[51] Int. Cl.[6] .................................................. B23K 1/018
[52] U.S. Cl. .................... 228/180.22; 228/201; 228/202; 228/19
[58] Field of Search ................................ 228/19, 180.22, 228/201, 202

[56] References Cited

U.S. PATENT DOCUMENTS 5,181,648  1/1993  Leicht ...................................... 228/201

FOREIGN PATENT DOCUMENTS 5-37136  2/1993  Japan ....................................... 228/19

OTHER PUBLICATIONS

R. G. Christensen et al., "Flux Removal Tool," IBM Tech. Discl. Bull., vol. 19, No. 9, pp. 3395–3396, Feb. 1977.

Primary Examiner—Patrick Ryan
Assistant Examiner—Jeffrey T. Knapp
Attorney, Agent, or Firm—H. Donald Nelson

[57] ABSTRACT

A method of assembling a substrate and die in a flip chip configuration uses a non-hazardous cleaning solvent to clean the flux residue. The non-hazardous cleaning solvent utilized is Ionox obtained from Kyzen Corporation. Optimized process parameters are: time 10–30 minutes, temperature 70–90° C., pressure 40–70 psi, rotation speed and reversals 100–1000 rpm and 24–100 reversal cycles.

5 Claims, 2 Drawing Sheets

FLUX CLEANING FOR FLIP CHIP TECHNOLOGY USING ENVIRONMENTALLY FRIENDLY SOLVENTS

BACKGROUND OF THE INVENTION

1. Field of the Invention

This invention relates generally to a method of assembly of a semiconductor device in a flip chip configuration. More specifically this invention relates to a method of flux cleaning using environmentally friendly solvents.

2. Discussion of the Related Art

The most important objective of semiconductor packaging is to support the original design objective and intent of the integrated circuit chips. In today's technology environment, there is an ever-increasing requirement to increase the integration of circuits onto a single semiconductor chip. At the same there is a requirement to increase the performance of the semiconductor chip, whether it is a memory chip, a microprocessor chip, a telecommunications chip or any other type of semiconductor chip. As more and more circuit functions are added to a chip, the number of interconnections also increases dramatically. An overriding factor in the increase of integration and increase of performance is the requirement to reduce the cost of the final product.

An early flip chip method of packaging semiconductors was developed in the early 1960s by IBM as a possible replacement for the expensive, unreliable, low-productivity, and manually operated face-up wire-bonding technology. However, because high-speed automatic wire bonders for the most part met the needs of the semiconductor industry there was not an aggressive development effort expended to improve the flip chip technology methods. Flip chip technology is defined as mounting the semiconductor chip to a substrate with any kind of interconnect materials and methods such as fluxless solder bumps, tape-automated bonding (TAB), wire interconnects, conductive polymers, anisotropic conductive adhesives, metallurgy bumps, compliant bumps, and pressure contacts as long as the active chip surface is facing the substrate.

As a direct result of the higher requirements of package density, performance, and interconnection; the limitations of face-up wire bonding technology; and the growing use of multichip module technology there is a need to improve the flip chip technology and to decrease the cost of the flip chip technology at the same time. The flip chip interconnects are being used in the semiconductor industry primarily because of their high I/O density capability, small profiles, and good electrical performance. Demands on performance, reliability, and cost have resulted in the development of a variety of flip chip technologies using solder, conductive epoxy, hard metal bump (such as gold) and anisotropic conductive epoxy interconnects. Among these materials, solders have remained a preferred choice as the material forming electrical connections in flip chip assemblies.

Solder flip chip interconnect systems consist of essentially three basic elements. These include the chip, the solder bump, and the substrate. The bumps are first deposited on a wafer and reflowed. The wafer is then diced into chips. The chips are flipped over, aligned to a substrate, tacked, and reflowed. An underfill may be used to improve the reliability of the interconnects. Each of these elements and the processes used to assemble them together affect the performance and the cost of the interconnect system. Therefore, the performance and cost must be compared on the basis of the interconnect system as a whole, and not merely on any single element of the interconnect assembly.

The materials and processes involved in the manufacture of the flip chip interconnect system determine its performance. The semiconductor device or the chip may be silicon or gallium arsenide. The bond pad metalization on the wafer can be Ni—Au, Cr—Cu—Au, TiW—Cu, Ti—Cu, or TiW—Au. The bump material can be one of a variety of Pb-based or Pb-free solders. The substrate can be silicon, alumina, glass, or one of a variety of organic substrates. The substrate metallization can be gold or copper. Underfills are used prinarily to improve reliability of flip chip interconnect systems. These materials fill the gap between the chip and substrate around the solder joints, reducing the thermal stresses imposed on the solder joint.

The process step used in the manufacture of the interconnect systems can be varied and include process technologies such as plating, evaporation, wire bumping, dispensing, and printing. The reflow process may be performed in air with flux or in a controlled ambient. Flip chip bonding processes include those based on the controlled-collapse chip connection (C4) approach or those in which the geometry of the bump is controlled by the bonding equipment.

The assembly of a typical flip chip interconnect system involves two overall tasks: (1) flip chip bonding and (2) encapsulation or underfill. During flip chip bonding, the bumped die is first aligned and attached to the bond pads on the substrate using a tacky flux. (It is noted that the bumps can be formed on the substrate or on both the substrate and die and that the bond pads can be formed on the die). Then the module is heated so that the solder melts and forms a metallurgical bond with the bond pad (the reflow process). Following the flip chip bonding process the flux residues are cleaned. The solvent materials necessary to clean the flux residues are typically highly flammable and/or hazardous materials and some may be carcinogenic. Typical solvents used for such cleaning are Xylene, Toluene, and Terpene which are either safety hazards or health hazards. Because of these characteristics of the solvent materials, the cleaning step is very expensive because it requires highly specialized equipment. The equipment may have to be explosion proof, it may have to have special filtering systems to protect the surrounding community as well as the technicians from air pollution and/or water pollution.

Therefore, what is needed is a cleaning solvent and a method of flux cleaning that is environmentally friendly.

SUMMARY OF THE INVENTION

According to the present invention, the foregoing and other objects and advantages are attained by a method of assembling a substrate and die in a flip chip configuration using an environmentally friendly non-hazardous solvent. In accordance with one aspect of the invention, Ionox from Kyzen Corporation is used as the cleaning solvent.

According to another aspect of the invention, the cleaning process is carried out with the following process parameters:

time 10–30 minutes temperature 70–90° C.

pressure 40–70 psi rotation speed and reversals 100–1000 rpm and 25–100 reversal cycles.

The method of the invention uses a non-hazardous cleaning solvent and allows the use of standard commercially available cleaning equipment.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1:
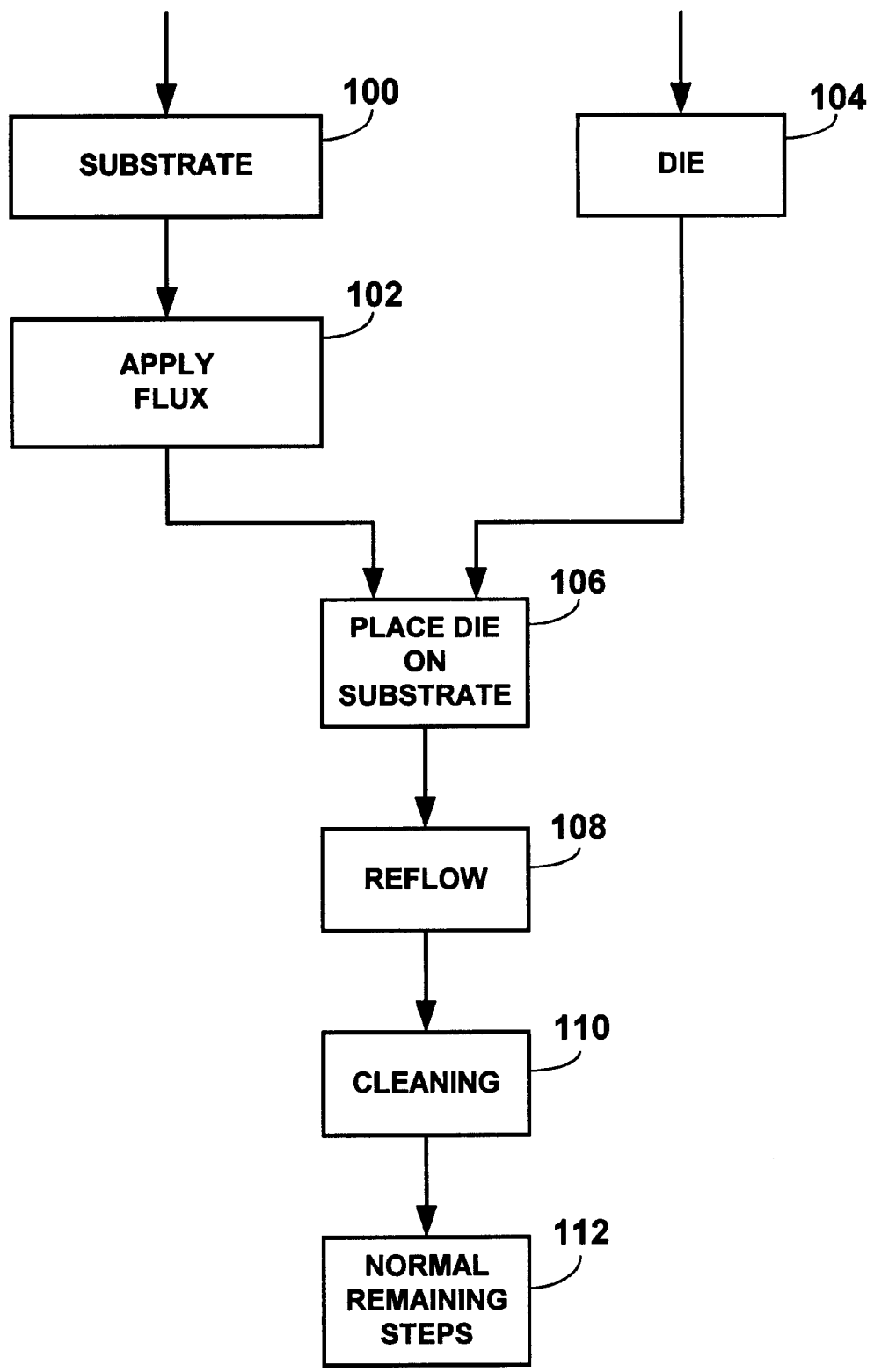
FIG. 1 is a flow diagram showing the method of assembling a substrate and die in a flip chip configuration in accordance with the present invention.

FIG. 1 is a flow diagram showing the method of assembling a chip and a substrate in a flip chip configuration in accordance with the present invention. FIG. 1 shows a substrate, indicated at 100 that has been formed by standard methods in the semiconductor manufacturing art. The substrate could be silicon, alumina (ceramic), glass, or one of a variety of organic substrates. Bond pads or solder bumps are formed on the substrate. Flux is applied to the substrate and bond pads or solder bumps as indicated at 102 by either brushing or spraying the flux onto the appropriate portion of the substrate. The die, indicated at 104 is a normal die and can be made on a silicon substrate or a gallium arsenide substrate. Bond pads or solder bumps are formed on the die and correspond to the bond pads or solder bumps formed on the substrate as discussed above. The bump material can be a variety of Pb-based or Pb-free solders. The bond pad metallization of the wafer can be Ni—Au, Cr—Cu—Au, TiW—Cu, Ti—Cu, or TiW—Au. The die is placed on the substrate in a flip chip configuration as indicated at 106. A flip chip configuration is one in which the active surface area is placed "face-down" onto the substrate. The substrate/chip combination is then heated to cause the solder to reflow as indicated at 108. The substrate/chip combination is cleaned as indicated at 110, and underfill is applied between the substrate and die as indicated at 112 and subjected to normal manufacturing steps as indicated at 114.

Figure 2C:
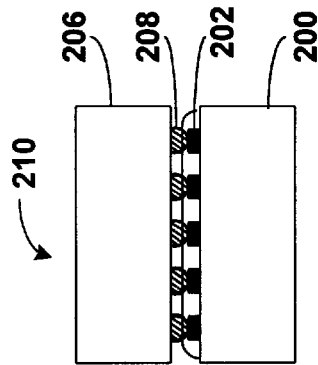
FIGS. 2A–2F show views of the substrate/die during the process steps of assembling the substrate/die module in accordance with the present invention.
Figure 2F:
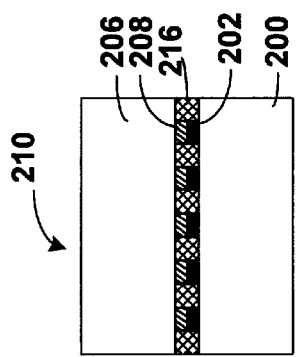
Figure 2B:
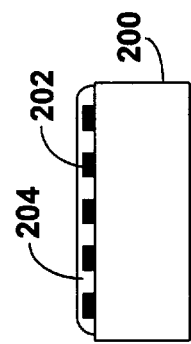
Figure 2E:
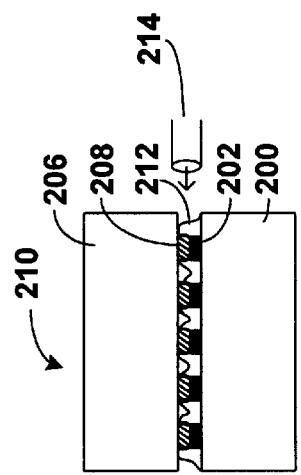
Figure 2A:
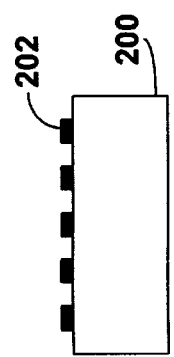

FIGS. 2A–2F show views of the substrate, die, and substrate/die module during the process steps of assembling the substrate/die module in accordance with the present invention. FIG. 2A shows a substrate 200 with bond pads, one of which is indicated at 202 formed on the substrate 200. As noted above, the substrate could be silicon, alumina (ceramic), glass, or one of a variety of organic substrates. The bond pad metallization of the wafer can be Ni—Au, Cr—Cu—Au, TiW—Cu, Ti—Cu, or TiW—Au. The selection of the bond pad material is partially dependent upon the material of the substrate. For example, if the substrate is a ceramic material, the bond pad material is Ni—Au and if the substrate is an organic material, the bond pad material is Cu.

FIG. 2B shows a flux 204 having been applied to the substrate 200. One of the main purposes of the flux 204 is to provide a tacky surface to hold the die (to be discussed) to the substrate 200 during the reflow process (to be discussed). Fluxes commonly contain three constituents: a solvent (e.g., alcohol), a vehicle (e.g., a high-boiling-point solvent such as aliphatic alcohol), and an activator (e.g., carboxylic acids). The solvent facilitates uniform spreading of the flux 204 on the bond pads. The reflow process (to be discussed) usually consists of a preheat step where the solvent is vaporized. This promotes a uniform coating of the flux 204 on the solder and bond pad metallization. The flux 204 also becomes more viscous and tacky. Further increase in temperature causes the vehicle to flow along with the activator. The activator reduces the oxides, while both the vehicle and activator volatilize.

FIG. 2C shows a die 206 with bumps, one of which is indicated at 208, formed on the active surface of the die 206. The die 206 is placed face down on the substrate in a flip chip configuration forming a substrate/die module 210. As discussed above, the tackiness of the flux 204 holds the die 206 is proper alignment with the substrate 200 so that the bond pads 202 and the solder bumps 208 are properly aligned. The substrate/die module 210 is ready for the reflow step. During the reflow process the solder bumps 208 are heated to a temperature above the melting point of the solder. When the solder melts, it forms a metallurgical bond with the bond pads 202.

Figure 2D:
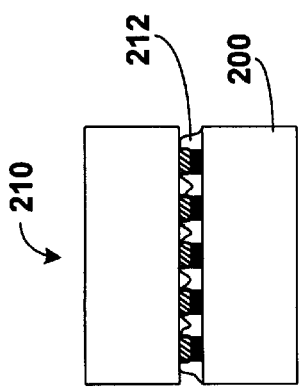

FIG. 2D shows the substrate/die module 210 after the reflow process has been completed. Flux residue areas, one of which is indicated at 212, remain between the substrate 200 and the die 206. The flux residue areas 212 commonly contain residues from the carrier, the wetting agent, and reaction by-products of the reduction reaction. The flux residue areas 212 as shown in interfere with the flow of underfill material (to be discussed below).

FIG. 2E shows the substratel/die module 210 being subjected to a cleaning process, indicated to 214 in which a solvent material is utilized to remove the flux residue areas 212. The flux residue areas 212 are formed during the reflow processes and are polymerized residue. This is typical of all rosin based activated fluxes. The excessive residue is harmfil to chips such as microprocessor chips because it would cause leakage between the bumps. Cleaning is required to remove the flux residue areas 212. A cleaning process has been developed that uses Ionox, a commercially available environmentally friendly solvent made by Kyzen Corporation. The developed cleaning process, in addition, uses commercially available centrifuigal cleaning equipment. The developed process has optimized process parameters such as time, temperature and pressure as well as rotation speed and reversals to effect efficient cleaning between the die 206 and substrate 200. The optimized process parameters are as follows:

1. time 10–30 minutes in Ionox,
2. temperature 70–90° C.
3. pressure 40–70 psi
4. rotation speed and reversals 100–1000 rpm and 25–100 reversal cycles.

FIG. 2F shows the substrate/die module 210 with an underfill material 216 applied in the gap between the substrate 200 and die 206. The underfill material is typically an epoxy. The underfill provides two functions. The first function of the underfill material is to protect the chip and interconnects during subsequent processes. The second function of the underfill is to improve the reliability of the interconnect system.

In summary, the results and advantages of using an environmentally friendly solvent can now be more filly realized. The use of a non-hazardous cleaning solvent allows the use commercially available cleaning equipment The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of assembling a substrate and die in a flip chip configuration, the method comprising:

forming bond pads on the substrate;

forming solder bumps on the die;

applying a flux to the bond pads and the substrate;

aligning the substrate and die with the solder bumps contacting the bond pads forming a substrate/die module;

subjecting the substrate/die module to a reflow process causing a flux residue to be formed between the die and the substrate; and cleaning the flux residue with a non-hazardous solvent.

2. The method of claim 1 wherein cleaning the flux residue with a nonhazardous solvent comprises cleaning the flux residue sufficiently to eliminate any solder joint unreliability.

3. The method of claim 2 wherein cleaning the flux residue is accomplished with the following process parameters:

time 10–30 minutes temperature 70–90° C.

pressure 40–70 psi rotation speed and reversals 100–1000 rpm and 25–100 reversal cycles.

4. The method of claim 3 wherein the flux can be a rosin based material.

5. The method of claim 4 wherein the flux can be a non-rosin based material.

* * * * *